United States Patent
Bean et al.

(10) Patent No.: US 8,648,301 B2
(45) Date of Patent: Feb. 11, 2014

(54) PARTICLE BEAM SYSTEM HAVING A HOLLOW LIGHT GUIDE

(71) Applicant: Carl Zeiss Microscopy Ltd., Cambridge (GB)

(72) Inventors: Stewart Bean, Wyton (GB); Michael Robert Astley, Waterbeach (GB)

(73) Assignee: Carl Zeiss Microscopy Ltd., Cambridge (GB)

( * ) Notice: Subject to any disclaimer, the term of this patent is extended or adjusted under 35 U.S.C. 154(b) by 0 days.

(21) Appl. No.: 13/623,829

(22) Filed: Sep. 20, 2012

(65) Prior Publication Data

US 2013/0075604 A1    Mar. 28, 2013

(30) Foreign Application Priority Data

Sep. 22, 2011   (EP) .................................... 11007726

(51) Int. Cl.
    *H01J 37/28*   (2006.01)
(52) U.S. Cl.
    USPC ........ 250/311; 250/306; 250/310; 250/396 R; 250/492.1; 250/492.3
(58) Field of Classification Search
    USPC .......... 250/306, 307, 310, 311, 396 R, 492.1, 250/492.3
    See application file for complete search history.

(56) References Cited

U.S. PATENT DOCUMENTS

| | | | |
|---|---|---|---|
| 3,474,245 A * | 10/1969 | Hifumi et al. ................. | 250/310 |
| 4,990,776 A | 2/1991 | Fushimi et al. | |
| 6,211,525 B1 * | 4/2001 | Cowham .................... | 250/484.2 |
| 6,600,156 B2 | 7/2003 | Kazumori | |
| 6,936,817 B2 * | 8/2005 | Feuerbaum .................... | 250/310 |
| 7,045,791 B2 | 5/2006 | Benas-Sayag et al. | |
| 7,297,948 B2 | 11/2007 | Benas-Sayag et al. | |
| 7,462,839 B2 * | 12/2008 | Gnauck et al. ................. | 250/397 |
| 7,573,050 B2 | 8/2009 | Benas-Sayag et al. | |
| 7,589,322 B2 * | 9/2009 | Nishikata et al. ............. | 250/310 |
| 2003/0215060 A1 * | 11/2003 | Ohzawa ......................... | 378/154 |
| 2008/0121799 A1 | 5/2008 | Kanno et al. | |
| 2008/0185509 A1 * | 8/2008 | Knowles ....................... | 250/251 |
| 2010/0038534 A1 * | 2/2010 | Hendrich ...................... | 250/307 |
| 2011/0226949 A1 * | 9/2011 | Zeidler et al. ................. | 250/310 |
| 2011/0291010 A1 * | 12/2011 | Katane et al. ................. | 250/310 |
| 2012/0199740 A1 * | 8/2012 | Zeidler et al. ................. | 250/310 |
| 2012/0273677 A1 * | 11/2012 | Tuma et al. ................... | 250/307 |

FOREIGN PATENT DOCUMENTS

| | | |
|---|---|---|
| EP | 1 724 809 A1 | 11/2006 |
| EP | 1 956 633 A2 | 8/2008 |
| EP | 2 317 536 A2 | 5/2011 |
| JP | 11-265675 A | 9/1999 |
| WO | WO 2008/058491 A2 | 5/2008 |
| WO | WO 2011/030156 A2 | 3/2011 |

OTHER PUBLICATIONS

The Extended European Search Report for the corresponding EP Appl No. 11 007 726.0, dated Mar. 5, 2012.

* cited by examiner

*Primary Examiner* — Michael Logie
(74) *Attorney, Agent, or Firm* — Fish & Richardson P.C.

(57) ABSTRACT

A system includes a particle optical system and a photosensitive detector. The particle optical system includes a charged particle beam source and an objective lens. The charged particle beam source is configured to generate a charged particle beam that travels along a particle beam path, and the objective lens is configured to focus the particle beam onto an object plane of the particle optical system. The system is configured such that a light beam path of the system extends from the object plane to the photosensitive detector.

19 Claims, 8 Drawing Sheets

PARTICLE BEAM SYSTEM HAVING A HOLLOW LIGHT GUIDE

CROSS-REFERENCE TO RELATED APPLICATION

This application claims priority under 35 U.S.C. §119 to European Patent Application No. 11 007 726.0, filed Sep. 22, 2011, entitled "PARTICLE BEAM SYSTEM HAVING A HOLLOW LIGHT GUIDE", the entire contents of which are hereby incorporated by reference.

FIELD

The disclosure relates to a system having a particle beam path, especially a beam path of charged particles, and a light beam path. The light beam path extends from the object plane to a photosensitive detector. More specifically, the disclosure relates to a charged-particle beam microscope having a detector for detecting cathodoluminescence light, which exits the sample at an impingement location of the charged particle beam.

BACKGROUND

Scanning charged particle microscopes which have a detector system for detecting cathodoluminescence light are commonly known. Cathodoluminescence provides an especially powerful analysis tool in the study of semiconductors. The energy levels in semiconductor materials and insulators are affected by the concentrations of impurities, carriers and electrically active defects. Also in geology, mineralogy and biology, cathodoluminescence has a wide range of applications.

Cathodoluminescence light is generated when the beam of charged particles impinges on the object surface, thereby causing a variety of excitations that result in radiation emitted from the interaction volume of the electron beam with the sample. The radiation may be in the visible range, ultraviolet range and/or in the infrared range.

The emitted light is analyzed to generate spectrally resolved cathodoluminescence images of the sample or local cathodoluminescence spectra. These data are indicative of the material composition of the object and of the chemical state of the present elements. Also, information with regard to mechanically induced defects in crystals, as well as processes, such as crystal growth, replacement, deformation and provenance can be derived from cathodoluminescence data.

For efficiently investigating the object's material composition, it is desirable for the cathodoluminescence light collection system to provide high light collection efficiency. This can allow detection even small fractions of materials within the object. Furthermore, cathodoluminescence light emission is often inherently low from specimens which are often used in geology and life sciences. For detector systems having low light collection efficiency, this may lead to long acquisition times.

Light collection systems which are optimized with respect to light collection efficiency can be difficult to arrange close to the interaction volume of the particle beam with the object because the objective lens, particle detectors and instrumentation for sample preparation and navigation usually take up considerable installation space.

SUMMARY

The disclosure provides a charged-particle system having an efficient detector system for cathodoluminescence light which involves relatively little installation space.

Embodiments provide a system having a particle beam path, in particular a charged-particle beam path, and a light beam path, wherein the system includes: a particle optical system including: a charged particle beam source configured to generate a charged particle beam traveling along the particle beam path; an objective lens, which is configured to focus the charged particle beam onto an object plane of the particle optical system; wherein the system further includes: a photosensitive detector, wherein the system is configured such that the light beam path extends from the object plane to the photosensitive detector.

According to an embodiment, the system includes a hollow light guide including a channel, wherein the channel has an interior surface, which includes a light reflecting mirror surface; wherein the hollow light guide is arranged in the particle beam path and the light beam path such that the charged particle beam is incident on the object plane after having passed the channel and light rays of the light beam path are guided by one or more reflections at the mirror surface through the channel.

Accordingly, a system is provided, having a hollow light guide, wherein the particle beam path and the light beam path extend through the hollow light guide. Hence, a portion of the space, which is used for guiding the particle beam path to the object plane, is also used to guide light from the object plane to the photosensitive detector. Therefore, the light beam path takes up only a small amount of additional space within the system. Furthermore, since the light beam path and the particle beam path extend through the channel, it is possible to arrange the hollow light guide such that an entrance aperture of the channel, through which the light rays enter the channel, is arranged close to the object plane. Thereby, a high collection efficiency is achievable.

In contrast thereto, conventional cathodoluminescence light collection systems often include a mirror between the object plane and the objective lens. The mirror directs the light rays in a direction away from the optical axis. The particle beam passes through a small hole provided in the mirror. The field of view for the scanning of the particle beam can be restricted by the small hole. As disclosed herein, however, both the light beam path and the particle beam path can extend through the hollow light guide. Therefore, no mirror is necessary between the objective lens and the object plane to direct the light beam in a direction different from the optical axis, thereby avoiding restriction of the field of view caused by the presence of the mirror.

The system may for example be an electron microscope, in particular a scanning electron microscope. Alternatively, the system may be a scanning ion microscope, such as a helium ion microscope. The system may be configured to scan the object plane with the charged particle beam. The light beam path may be a light beam path for detecting cathodoluminescence light, which is emitted from an interaction volume of the charged particle beam with an object. The interaction volume may be located in the object plane.

The photosensitive detector may be configured to detect light of a pre-selected wavelength or a pre-selected wavelength range. Additionally or alternatively, the detector may be configured to detect a spectral power distribution of the light for a pre-determined wavelength range. By way of example, the photosensitive detector may be a photomultiplier tube assembly or a spectrometer.

The channel may be configured to surround a section of the light beam path and a section of the particle beam path. The channel may include an entrance aperture and an exit aperture. Through the entrance aperture, light rays of the light beam path may enter into the channel. Through the exit face, the light rays may exit from the channel. The light beam path may pass the channel from the entrance aperture to the exit aperture. The particle beam path may pass the channel from the exit aperture to the entrance aperture. The interior surface of the channel may be a surface, which connects the entrance aperture with the exit aperture. Unlike an exterior surface of the hollow light guide, the interior surface may be visible from within the channel.

The channel may be rotationally symmetric with respect to the optical axis of the particle optical system. The channel may have the form of a cylinder. A diameter of the channel, measured perpendicular to the optical axis, may vary by less than 200% or less than 100% or less than 50%, or less than 20% relative to a diameter of the entrance aperture of the channel. The diameter of the channel may be in the range of 2 mm to 5 mm, or in a range of 1 mm to 10 mm. A length of the channel may be in the range of 10 mm to 50 mm or in the range of 10 mm to 150 mm. The hollow light guide may have the form of a tubular body.

The hollow light guide may include more than one, in particular two or three channels. The particle beam path and the light beam path may extend through each of these channels. Each of the channels may include an interior surface having a light reflecting mirror surface. Each of the channels may have an entrance aperture and an exit aperture.

The light beam path extends from the object plane to the photosensitive detector. The system may include further components, such as mirrors, lenses, light optical fibers and/or further hollow light guides to guide the light rays from the object plane to the photosensitive detector.

Light rays of the light beam path are guided through the channel by one or more reflections at the mirror surface. The reflections may be specular reflections or substantially specular reflections. In other words, an angle of incidence and an angle of reflection at the mirror surface are identical or substantially identical.

According to an embodiment, the system further includes a deflecting mirror, which is located downstream of the hollow light guide along the light beam path. The deflecting mirror may be arranged between an exit aperture of the channel and the photosensitive detector in the light beam path. The deflecting mirror may deflect light rays, which exit from the channel through the exit aperture toward the photosensitive detector. The deflecting mirror may include an aperture which is arranged such that the charged particle beam passes through the aperture.

According to a further embodiment, at each point within the channel, a longitudinal axis of the channel forms an angle with the optical axis of the particle optical system, which is less than 20 degrees, or less than 10 degrees, or less than 5 degrees, or less than 2 degrees.

According to an embodiment, the mirror surface has a surface RMS roughness, which is less than 20 μm, or less than 10 μm, or less than 1 μm. According to a further embodiment, the RMS surface roughness of the mirror surface is less than 500 nm or less than 100 nm. The surface roughness may be greater than 10 nm.

Accordingly, a system is provided, which has a high collection efficiency. A low surface RMS roughness of the mirror surface results in a higher collection efficiency for the cathodoluminescence light.

The surface RMS roughness is a measure for the vertical deviations of a real surface from its intended form. The surface RMS roughness may be determined at a given length scale. The length scale at which the surface RMS roughness is determined may have values from 0.2 μm to 100 μm or from 0.2 μm to 1 mm.

The mirror surface may be at least partly configured as a thin film. The thin film may consist of metal. The thin film may for example be of gold or a gold alloy. The thin film may be deposited on a substrate, which may for example be made of stainless steel, alumina, glass and/or plastics. Additionally or alternatively, the mirror surface may be provided by a metal foil. The metal foil or the thin film may be deposited on a substrate made of stainless steel, alumina, glass and/or plastics.

According to a further embodiment, the hollow light guide is at least partly received within the objective lens. In other words, at least a portion of the hollow light guide or all of the hollow light guide may be received within the objective lens. According to a further embodiment, at least one plane, which is perpendicular to the optical axis of the particle optical system intersects the hollow light guide and the objective lens. The at least one plane, which is perpendicular to the optical axis may for example be a principal plane of the objective lens.

According to an embodiment, the system is configured such that in at least one plane, which is perpendicular to an optical axis of the particle optical system, a minimum radial distance of the hollow light guide from the optical axis is equal to or smaller than a minimum radial distance of the objective lens from the optical axis. The at least one plane, which is perpendicular to the optical axis may for example be a principal plane of the objective lens.

Accordingly, since the hollow light guide is at least partly received in the objective lens, there is space available between the objective lens and the object plane for further devices. Examples for such further devices are particle detector systems (such as an in-chamber secondary electron detector), devices for sample manipulation or preparation (such as a gas injection system), or devices for object navigation within the specimen chamber.

The minimum radial distance of the hollow light guide or the objective lens from the optical axis is measured in the plane perpendicular to the optical axis. The term radial may refer to a radial direction with respect to the optical axis. The minimum radial distance may be defined as the smallest radial distance of all radial distances in the plane. For example, the minimum radial distance of the hollow light guide from the optical axis may be a minimum distance of the interior surface from the optical axis, measured in the plane, which is perpendicular to the optical axis.

The radial distance of the hollow light guide may be defined as the distance of the interior surface of the channel from the optical axis measured in an arbitrary radial direction in the plane perpendicular to the optical axis. The minimum radial distance then may be defined as the shortest of these radial distances in the plane perpendicular to the optical axis. By way of example, when the hollow light guide is rotationally symmetrically arranged about the optical axis, the minimum radial distance of the hollow light guide corresponds to the half opening diameter of the channel. The radial distance of the objective lens may be the distance between the optical axis and the inner surface of a bore in a pole piece of the objective lens or the distance between the optical axis and the inner surface of a bore in an electrode of the objective lens measured in an arbitrary radial direction in the plane perpendicular to the optical axis. The minimum radial distance then means the shortest of these radial distances in the plane perpendicular to the optical axis. For a rotationally symmetric objective lens, the minimum radial distance is the same in all radial directions for a particular plane perpendicular to the optical axis.

According to a further embodiment, in each plane, which is perpendicular to the optical axis and which intersects the hollow light guide and the objective lens, a minimum radial distance of the hollow light guide from the optical axis is equal to or smaller than a minimum radial distance of the objective lens from the optical axis.

According to a further embodiment, the hollow light guide is further configured such that at least a portion of the light rays of the light beam path is first incident on the mirror surface after having been emitted from the object plane.

Accordingly, for a portion of light, which is guided through the hollow light guide to the photosensitive detector, there is no further optical element used for collecting light and directing it to the hollow light guide.

According to a further embodiment, the light beam path extends through the objective lens. According to a further embodiment, at least a portion or all of the hollow light guide extends through the objective lens. According to a further embodiment, the light beam path and/or the hollow light guide passes through a principal plane of the objective lens.

According to a further embodiment, the objective lens includes a pole piece having a pole face which defines a pole face aperture of the pole piece, wherein the light beam path extends through the pole face aperture or at least a portion of the pole face aperture; and/or wherein the objective lens includes an electrostatic lens electrode having an electrode aperture, wherein the light beam path extends through the electrode aperture or at least a portion of the electrode aperture. The portion of the electrode aperture and/or the portion of the pole face aperture may be an axial portion along the optical axis. The light beam path and/or the hollow light guide may extend through at least a portion of a bore opening of a pole piece or a portion of a bore opening of an electrostatic electrode.

The pole face may be defined as a surface portion of the pole piece, where the magnetic flux leaves the pole piece. The pole face aperture may be defined as an aperture, which is formed by a pole face of the pole piece. At least a portion of the interior surface of the hollow light guide may be configured to be conductive. At least a portion of the conductive surface may act as an electrode of the objective lens. Accordingly, since the light rays are guided through the channel by one or more reflections, the light beam path extends through the aperture of the electrode, which is formed by the conductive surface of the hollow light guide.

The light beam path may extend through pole face apertures of an inner and an outer pole piece of the objective lens. The light beam path may pass through all pole face apertures of all pole pieces of the objective lens and/or may pass through all apertures defined by all electrostatic lens electrodes of the objective lens.

According to a further embodiment, the objective lens includes a pole piece having a pole face defining a pole face aperture of the pole piece, wherein the hollow light guide extends through the pole face aperture or at least a portion of the pole face aperture; and/or wherein the objective lens includes an electrostatic lens electrode having an electrode aperture, wherein the hollow light guide extends through the electrode aperture or at least a portion of the electrode aperture.

According to an embodiment, the objective lens includes a portion, which defines an aperture of smallest diameter of all apertures of the objective lens, wherein the light beam path, the particle beam path and/or the hollow light guide passes through the aperture of smallest diameter.

The hollow light guide may extend through apertures of pole faces of an inner and an outer pole piece of the objective lens. The hollow light guide may extend through all apertures of the pole faces of all pole pieces of the objective lens and/or may extend through all apertures defined by all electrostatic lens electrodes of the objective lens.

According to a further embodiment, at least a portion of the interior surface of the hollow light guide is configured to be conductive and the electrode aperture is formed by the conductive portion of the interior surface.

According to a further embodiment, the system further includes a pressure limiting aperture, wherein the system is configured such that the light beam path and the particle beam path extend through the pressure limiting aperture.

Accordingly, a system is provided, which allows to maintain a differential pressure between two vacuum chambers of the system. Thereby, a lower vacuum level may be achieved within the particle optical system.

The pressure limiting aperture may be arranged between the entrance aperture and the charged particle beam source. The pressure limiting aperture may be configured such that it separates two vacuum chambers of the system by maintaining a pressure difference of at least one or two orders of magnitude. The pressure limiting aperture may have a diameter of between 0.05 and 1.5 mm, or between 0.3 mm and 1.5 mm, or between 0.5 mm and 1.3 mm. For example, the diameter may be 0.7 mm or 1 mm.

The pressure limiting aperture may form part of the channel. The pressure limiting aperture may be formed by a diaphragm or a nozzle. An interior surface of the nozzle may include a reflective mirror surface, such that the light rays are guided through the nozzle by one or more reflections at the reflective mirror surface.

According to a further embodiment, the channel includes an entrance aperture through which the light rays enter into the channel.

The light beam path and the particle beam path may pass through the entrance aperture. The portion of the hollow light guide, which forms the entrance aperture may be configured to act as an electrode surface or a magnetic pole face.

According to an embodiment, the entrance aperture is located between the objective lens and the object plane. According to a further embodiment, the objective lens includes a pole piece and/or an electrostatic lens electrode; wherein the entrance aperture is located between the object plane and the pole piece and/or between the object plane and the electrostatic lens electrode. According to a further embodiment, a minimum distance between the objective lens and an intersection point of the optical axis with the object plane is greater, in particular 1.5 times greater or 2 times greater, than a minimum distance between the entrance aperture and the intersection point.

Accordingly, a hollow light guide is provided, wherein the entrance aperture is located comparatively close to the object plane. Thereby, the solid angle subtended by light rays, which enter into the channel is comparatively large.

According to an embodiment, a minimum distance between the entrance aperture and the objective lens may be at least 0.2 times, or at least 0.3 times, or at least 0.5 times or at least 0.7 times a focal length of the objective lens. The minimum distance may be smaller than 1.2 times the focal length of the objective lens.

The minimum distance between the entrance aperture and the objective lens may be the minimum distance between the entrance aperture and a pole piece of the objective lens and/or a minimum distance between the entrance aperture and an electrostatic lens of the objective lens.

At least one of the following components may be regarded as separate components from the objective lens and, hence, are not considered, when determining the minimum distance to the objective lens: particle detectors, in-chamber particle detectors (i.e. particle detectors, which are located outside of the particle optical system), gas injection systems, shielding electrodes, which are configured to shield the charged particle beam from a charging of the object surface or to reflect at least a part of the secondary electrons. The shielding electrode may be arranged between the objective lens and the object plane.

The minimum distance between two bodies may be determined by determining a smallest distance between any two points of the two bodies, wherein the line between the two points connects the two bodies.

According to a further embodiment, a minimum distance between the entrance aperture and the objective lens, in particular a pole piece or an electrostatic lens of the objective lens, may be in the range of 2 mm to 8 mm, or in the range of 2 mm to 15 mm, or in the range of 2 mm to 20 mm, or in the range of 5 mm to 20 mm.

According to a further embodiment, the system includes a particle detector and the objective lens includes an object side end face; wherein the particle detector is arranged at the object side end face. According to a further embodiment, the hollow light guide includes a protruding portion, which protrudes from the object side end face such that a minimum distance between the protruding portion and the object plane is shorter than a minimum distance between the objective lens and the object plane.

Accordingly, a system is provided, having a high collection efficiency for particles and for cathodoluminescence light.

The particle detector may include a particle receiving surface, which is arranged circumferentially around the protruding portion of the hollow light guide. The particle receiving surface may be a surface, where particles impinge, which are to be detected. The particle receiving surface may be oriented perpendicular to the optical axis. The particle receiving surface may have an annular shape. The particle detector may be a detector for backscattered electrons. The end face of the objective lens may be defined as a surface portion of the objective lens, which faces the object plane and/or which is located closest to the object plane. The object side end face may define an aperture, through which the hollow light guide extends.

According to an embodiment, in a plane, which is perpendicular to the optical axis and which intersects the protruding portion and the particle detector, in particular the particle receiving surface of the particle detector, a minimum radial distance of the particle detector, or the particle receiving surface, from the optical axis is equal to or greater than a minimum radial distance of the protruding portion from the optical axis.

According to a further embodiment, the entrance aperture is symmetric with respect to the optical axis of the particle optical system.

Accordingly, images, which are generated depending on the detected cathodoluminescence light, are less likely to be significantly influenced by the topography of the object surface. Hence, information representing the composition of the object surface can more reliably be extracted from the data of the cathodoluminescence images. Hence, even small variations in the composition of the object surface are detectable.

According to a further embodiment, the system further includes a pressure limiting aperture, wherein the light beam path and the particle beam path extend through the pressure limiting aperture. The pressure limiting aperture may be arranged between the entrance aperture and the deflecting mirror.

According to a further embodiment, the pressure limiting aperture is arranged between the entrance aperture and the exit aperture of the channel. The pressure limiting aperture may be arranged within the channel.

According to a further embodiment, the system further includes a mirror, wherein the system is configured such that a portion of light of the light beam path, which emanates from the object plane, is reflected at the mirror toward the entrance aperture and is detected by the photosensitive detector.

The mirror may be arranged on a second side of an object holder opposite to a first side of the object holder, where the particle optical system is provided. The mirror may be a concave mirror. The concave surface may be directed to the object holder well as to the particle optical system.

The object may be deposited on a light transmissive object holder. the light transmissive object holder may be in the form of a slide. The object may be light transmissive. By way of example, the object may be of a light transmissive material and/or be a thin film. The portion of the light may traverse the light transmissive object holder after having been emitted from the object. The mirror may be fixed with respect to the column. Alternatively, the mirror may be fixed with respect to a holder for receiving and retaining the object and the light transmissive object holder.

According to a further embodiment, the channel further includes an exit aperture through which the light rays exit from the channel; wherein the objective lens includes a pole piece having a pole face, wherein an axial position of the exit aperture along an optical axis of the particle optical system is located between an axial position of at least a portion of the pole face and an axial position of a further component of the system; and/or wherein the objective lens includes an electrostatic lens electrode, wherein the axial position of the exit aperture is located between an axial position of at least a portion of the electrostatic lens electrode and the further component of the system. The further component may be the charged particle beam source, a condenser lens of the particle optical system, or a deflective mirror, which is arranged in the light beam path between the exit aperture and the photosensitive detector. Each of the axial positions may be measured along the optical axis. According to a further embodiment, a minimum distance between the exit aperture and the object plane is greater than a minimum distance between the objective lens and the object plane.

The channel may be configured such that light rays, which exit from the exit aperture, are directed toward the deflecting mirror. The particle beam path and the light beam path may pass through the exit aperture.

The system may include a beam booster system, which includes the electrostatic lens electrode. The electrostatic lens electrode may be formed by a pole piece of the objective lens. The entrance aperture may be arranged between the pole face of the outer pole piece and the object plane and the exit aperture may be arranged between the pole face of the inner pole piece and the charged particle beam source.

According to a further embodiment, the system further includes a voltage supply, wherein the interior surface includes a conductive surface, which is connected to the voltage supply. Accordingly, a hollow light guide is provided, wherein surface charging of the interior channel surface is prevented.

In case of the system being a scanning electron microscope, the conductive surface and the voltage supply may be configured such that the conductive surface can be set at a voltage level of up to +3 kV or up +5 kV or up to +8 kV above the EHT voltage. The EHT voltage may be defined as the voltage, which corresponds to the final landing energy, with which the electrons are incident on the sample. Thereby, the conductive surface may act as a beam booster, such that the electrons pass through the channel with a kinetic energy, which is higher than the landing energy.

Accordingly, the particles may pass at least a part of the objective lens at a high energy, which may result in reduced aberrations of the charged particle beam. Additionally or alternatively, the conductive surface of the channel may act as an electrode of the objective lens.

According to a further embodiment, the mirror surface is configured to collimate at least a first portion of the light rays; and/or wherein the mirror surface is configured such that at least a portion of the light rays is focused into a focus region of the light path. The focus region may be located at or may surround a focus point defined by at least a portion of the mirror surface.

According to a further embodiment, the system includes a pressure limiting aperture; wherein the system is configured such that the focus region is located at least partly in the pressure limiting aperture.

According to an embodiment, the system includes more than one, in particular two, three, or four hollow light guides, wherein each of the hollow light guides includes a channel having an interior surface, which includes a reflecting mirror surface; wherein each of the hollow light guides is arranged in the particle beam path and the light beam path such that the charged particle beam is incident on the object plane after having passed each of the channels and light rays of the light beam path are guided by one or more reflections at the mirror surfaces of the channels through each of the channel.

According to an embodiment, the system further includes a coupling system for detachably securing the hollow light guide to the particle optical system; wherein the system is configured such that, while leaving the particle optical system in an assembled state, the coupling system is releasable and the hollow light guide is individually removable from the particle optical system.

In other words, both steps of releasing of the coupling system and individually removing of the particle optical system may be carried out without disassembling the particle optical system.

The coupling system may include a screw connection, a locking connection and/or a clamping connection. The hollow light guide is removable from the particle optical system without removing further components from the particle optical system and without disassembling the particle optical system.

The hollow light guide may be configured such that it is seizable by a human hand and/or a tool from outside the particle optical system. For example, a protruding portion of the hollow light guide, which protrudes from the end face of the objective lens, may be configured such that the protruding portion is sizeable by a human hand or engageable with a tool. By using the hand or by operating the tool, the coupling system may be releasable. The tool may be a grasping tool, such as pliers or a wrench.

The system may be configured such that the hollow light guide is removable from the particle optical system by retracting the hollow light guide from a pole face aperture and/or an electrode aperture of the objective lens toward the object plane; or by guiding the hollow light guide through the pole face aperture or through the electrode aperture toward the object plane.

According to an embodiment, the system further includes: a second photosensitive detector; a light transmissive object holder, which is configured such that an object, is attachable to the light transmissive object holder; and wherein the system has a second light beam path extending from the object plane to the second photosensitive detector; wherein light rays of the second light beam path traverse the light transmissive object holder before entering the second photosensitive detector. The second light beam path may be located outside the objective lens or outside the particle optical system.

The light transmissive object holder may include a first surface, which is configured such that the object is attachable to the first surface. The light transmissive object holder may have a second surface which is opposite to the first surface. The second surface may be oriented parallel to the first surface. Thereby, the light transmissive object holder may be in the form of a slide. Alternatively, the light transmissive object holder may be in the form of a prism, wherein the second surface includes one or a plurality of slanted surface portions, which are slanted relative to the first surface. Additionally or alternatively, the second surface may include one or more arcuate surface portions.

Within the light transmissive object holder, at least a portion of the light rays of the second light beam path may undergo one or more total internal reflections. Additionally or alternatively, the light transmissive object holder may have a reflective coating on at least a portion of the surfaces of the light transmissive object holder, such that at least a portion of light rays of the second beam path, which are traveling within the light transmissive object holder, are reflected at the reflective coating.

The light transmissive object holder may have an exit surface, at which light rays of the second light beam path exit from the light transmissive object holder. The exit surface may be a side surface connecting the first and the second surface.

After having left the light transmissive object holder, the light rays of the second light beam path may enter the second photosensitive detector or a light guide, which guides the light rays to the second photosensitive detector.

BRIEF DESCRIPTION OF THE DRAWINGS

The foregoing disclosure as well as other advantageous features will be more apparent from the following detailed description of exemplary embodiments with reference to the accompanying drawings. It is noted that not all possible embodiments necessarily exhibit each and every, or any, of the advantages identified herein.

DETAILED DESCRIPTION

In the exemplary embodiments described below, components that are alike in function and structure are generally designated by alike reference numerals. Therefore, to understand the features of the individual components of a specific embodiment, the descriptions of other embodiments and the summary may be referred to.

Figure 1A:
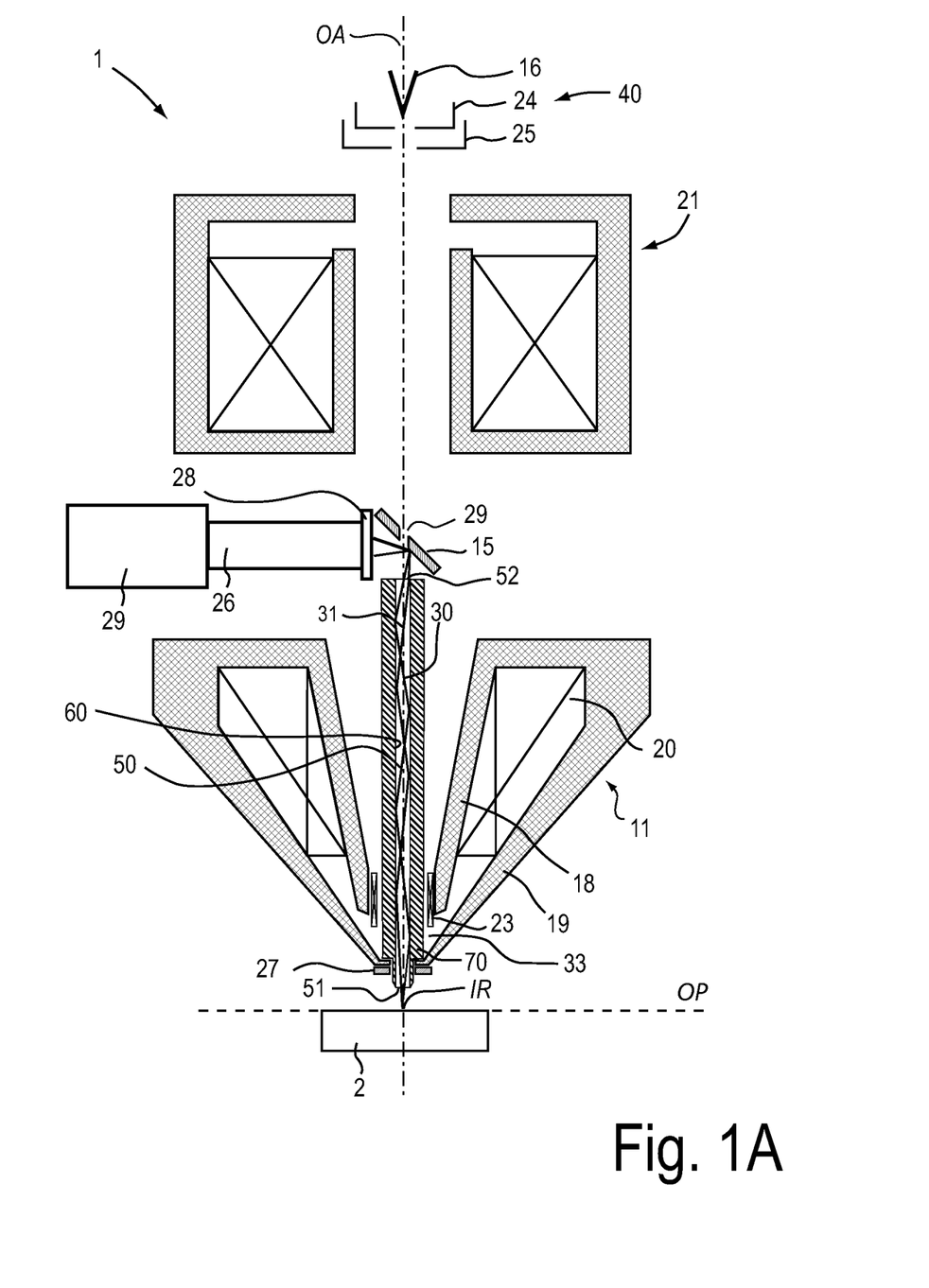
FIG. 1A is a schematic illustration of a system according to a first exemplary embodiment.

FIG. 1A is a schematic illustration of a system 1 according to a first exemplary embodiment. The system 1 is configured as a scanning electron microscope. The system 1 has an electron beam source 40 which includes a cathode 16, which may be for example be a Schottky field emitter. The electron beam source 40 further includes a suppressor electrode 24 and an extraction electrode 25. The electron source 40 is configured to generate a particle beam (not illustrated in FIG. 1), which passes a condenser system 21 and an objective lens 11 and is focused on an object plane OP of the system 1. In the object plane OP, a surface of an object 2 is arranged. The objective lens 11 includes an inner pole piece 18, an outer pole piece 19 and an excitation coil 20 for generating a magnetic field in a pole piece gap 33 between the inner pole piece 18 and the outer pole piece 19. The system 1 further includes deflecting coils 23 which are configured to deflect the electron beam in two mutually perpendicular directions in the object plane OP such that the particle beam scans the object plane OP.

The electron beam, which is incident on the object surface, causes electrons within the object 2 to be excited. These excitations result in cathodoluminescence light being emitted from the impingement location of the electron beam. The radiation may be in the visible range, in the ultraviolet range and/or in the infrared range.

The system 1 further includes a hollow light guide 70. The hollow light guide 70 has a channel 50. The channel 50 has an interior surface 60, an entrance aperture 51 and an exit aperture 52. The interior surface 60 connects the entrance aperture 51 with the exit aperture 52. Light, which emanates from an impingement location of the electron beam in the object plane OP, enters the hollow light guide 70 via the entrance aperture 51. The interior surface 60 includes a reflective mirror surface. The whole interior surface 60 of the channel may be configured as a reflective mirror surface. A portion of the light rays, which emanate from the interaction volume in the object plane OP, are guided by one or more reflections at the mirror surface from the entrance aperture 51 to the exit aperture 52. In FIG. 1A, this is illustrated by light rays 30 and 31. The hollow light guide 70 is further arranged such that the electron beam passes through the channel 50 from the exit aperture 52 to the entrance aperture 51. Thereby, the electron beam path and the light beam path extend through the channel 50.

The system 1 further includes a deflecting mirror 15. The deflecting mirror 15 is arranged such that at least a portion of the light rays, which have exited from the channel 50 via exit aperture 52, are reflected at the deflecting mirror 15 toward a window 28. The window 28 is attached to a light guide 26, which guides the light rays toward a photosensitive detector 29. In the present example, the photosensitive detector is a photomultiplier tube assembly and/or a spectrometer. The window 28 may be configured such that it separates a vacuum chamber of an electron optical column of the system 1 from the atmospheric pressure. Hence, the system 1 has a light beam path, which extends from the object plane OP to the photosensitive detector 29. In particular, the light beam path extends from an intersection of the optical axis OA with the object plane OP to the photosensitive detector 29. The deflecting mirror 15 further includes an aperture 29, which is arranged in the electron beam path such that the electrons pass through the aperture 29.

The interior surface 60 of the hollow light guide 70 is a conductive surface. Also an exterior surface of an object side end portion of the hollow light guide is a conductive surface. The conductive surfaces may be connected to a voltage supply, such that they can be biased at a selected voltage level. Thereby, a charging of the surface of the hollow light guide is prevented.

Figure 1B:
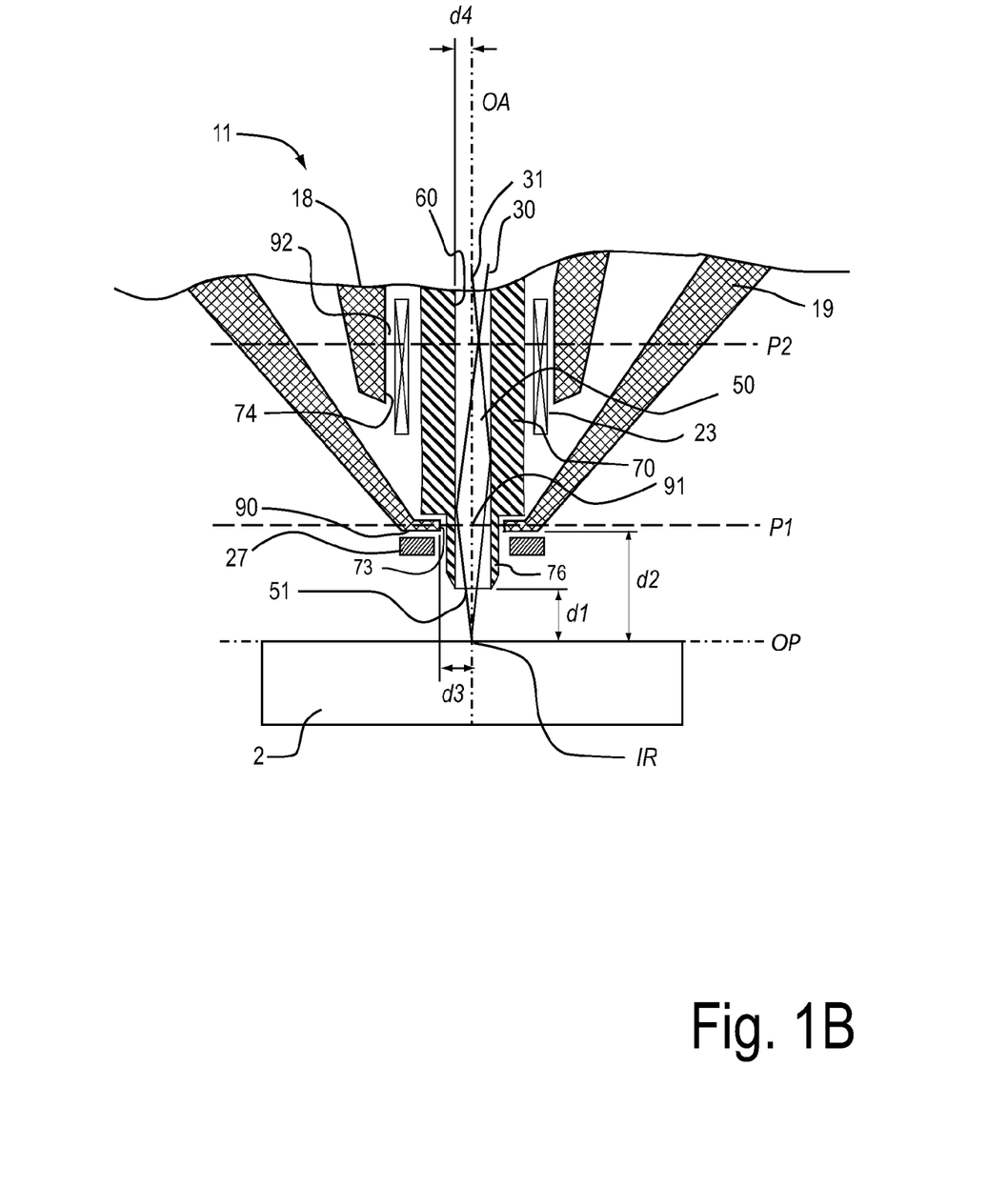
FIG. 1B is a detailed view of the schematic illustration of FIG. 1A.

FIG. 1B shows a lower portion of the system 1, as illustrated in FIG. 1A, in greater detail. The hollow light guide 70 includes a protruding portion 76, which protrudes from an object side end face 90 of the objective lens 11 toward the object plane OP. The end face 90 of the objective lens 11 is an end face of an outer pole piece 19 of the objective lens 11. A minimum distance d1 between the entrance aperture 51 of the hollow light guide 70 and the object plane OP is smaller than a minimum distance d2 between the end face 90 of the objective lens 11 and the object plane OP. Accordingly, the collection efficiency of cathodoluminescence light is increased. Furthermore, as can be seen from FIG. 1B, the entrance aperture 51 of the hollow light guide 70 is symmetrical with respect to the optical axis OA. Thereby, a solid angle, subtended by those light rays, which enter through the entrance aperture 51 after having emanated from the object plane OP, is symmetrical with respect to the optical axis OA. Accordingly, images, which are generated depending on the detected cathodoluminescence light, are less likely to depend significantly on the topography of the object surface. Hence, information representing the composition of the object surface can more reliably be extracted from the data of the cathodoluminescence images.

At the object side end face 90 of the outer pole piece 19, there is arranged a backscattered electron detector 27 for detecting backscattered electrons, which have been emitted from the interaction volume of the electron beam with the object 2. The backscattered electron detector 27 surrounds the aperture 91 defined by a pole face 73 of the outer pole piece 19. The backscattered electron detector 27 is arranged circumferentially about a protruding portion 76 of the hollow light guide 70. In particular, the backscattered electron detector 27 surrounds a portion of the hollow light guide 70, which protrudes from the end face 90 and which is located between the objective lens 11 and the object plane OP. Accordingly, it is possible to detect both cathodoluminescence light emission and backscattered electrons with a high efficiency simultaneously.

The pole face 73 of the outer pole piece 19 defines an aperture 91. The light beam and the hollow light guide pass through the aperture 91. In a plane P1, which is perpendicular to the optical axis OA, a minimum radial distance d3 of the objective lens 11 from the optical axis OA is greater than a minimum radial distance d4 of the hollow light guide 70 from the optical axis OA. Furthermore, in each plane, which is perpendicular to the optical axis OA and which intersects the hollow light guide 70 and the objective lens 11, a minimum radial distance of the objective lens 11 from the optical axis OA is greater than a minimum radial distance of the hollow light guide 70 from the optical axis OA.

Also the inner pole piece 18 includes a pole face 74. The pole face 74 of the inner pole piece 18 defines an aperture 92. The light beam path and the hollow light guide extend through the aperture 92 defined by the pole face 74 of the inner pole piece 18.

In a plane P2, which intersects the hollow light guide 70 and the deflection coils 23, a minimum radial distance of the deflection coils 23 from the optical axis OA is greater than a minimum radial distance of the hollow light guide 70 from the optical axis OA.

Figure 2:
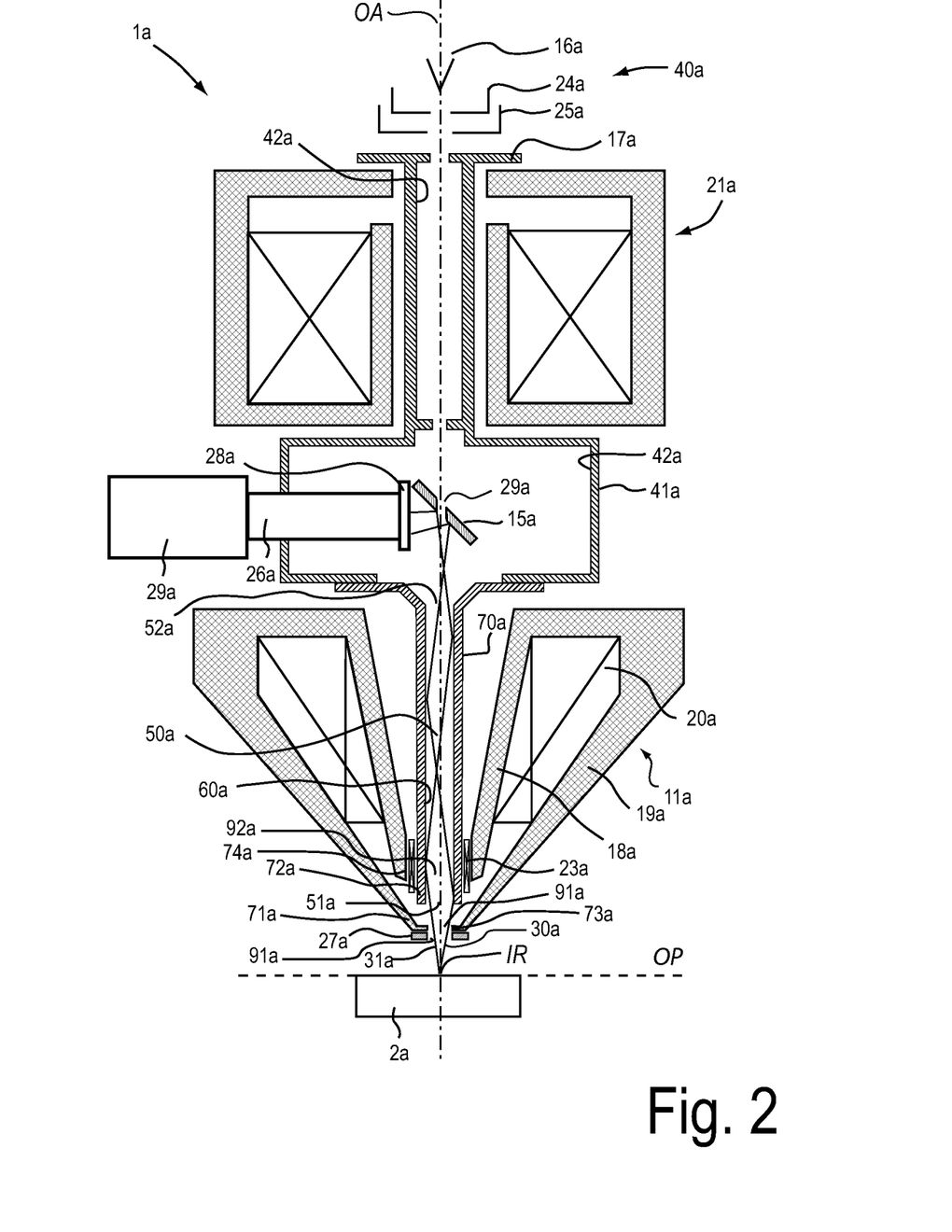
FIG. 2 is a schematic illustration of a system according to a second exemplary embodiment.

FIG. 2 shows the system according to a second exemplary embodiment. Components, which correspond to components of the particle beam system 1 shown in FIGS. 1A and 1B with regard to their composition, their structure and/or function are designated in FIG. 2 with the same reference numerals, wherein an additional letter is added to indicate differentiation.

The system 1a includes a beam booster 41a, which has a conductive interior surface 42a. The conductive interior surface 42a is connected to a voltage supply (not shown in FIG. 2) for biasing the interior surface 42a at a pre-selected voltage level. The beam booster system 41a further includes the hollow light guide 70a and the interior surface 60a of the hollow light guide 70a is configured to be conductive. The conductive surface 60a and the conductive surface 70a are electrically connected. The beam booster system 41a further includes an anode 17a, which is arranged in the electron beam path between the electron beam source 40a and the condenser system 21a and is placed at the same electrical potential as the conductive surfaces 42a and 60a.

An object side end portion 72a of the hollow light guide 70a and an object side end portion 71a of the outer pole piece 19a form electrodes of an electrostatic lens of the objective lens 11a. Thereby, the objective lens 11a represents an electrostatic/magnetic lens combination. Accordingly, a system is provided, which includes a beam booster system 41a for reducing the spherical and chromatic aberration of the electron beam, wherein the beam booster system 41a is further configured such that cathodoluminescence light can be collected with a high collection efficiency.

In the system 1a, the hollow light guide 70a extends through the aperture 92a formed by the pole face 74a of the inner pole piece 18a. The entrance aperture 51a is located between the aperture 91a formed by the pole face 73a of the outer pole piece 19a and the aperture 92a formed by the pole face 74a of the inner pole piece 18a.

As can be seen from FIG. 2, the exit aperture 52a has an axial position along the optical axis OA of the particle optical system, which is located between an axial position of the pole face 74a of the inner pole piece 18a and an axial position of the particle beam source 16a. Furthermore, the axial position of the exit aperture 52a is located between an axial position of a portion of the electrostatic lens electrode 72a, which is located closest to the object plane OP, and the particle beam source 16a.

Figure 3A:
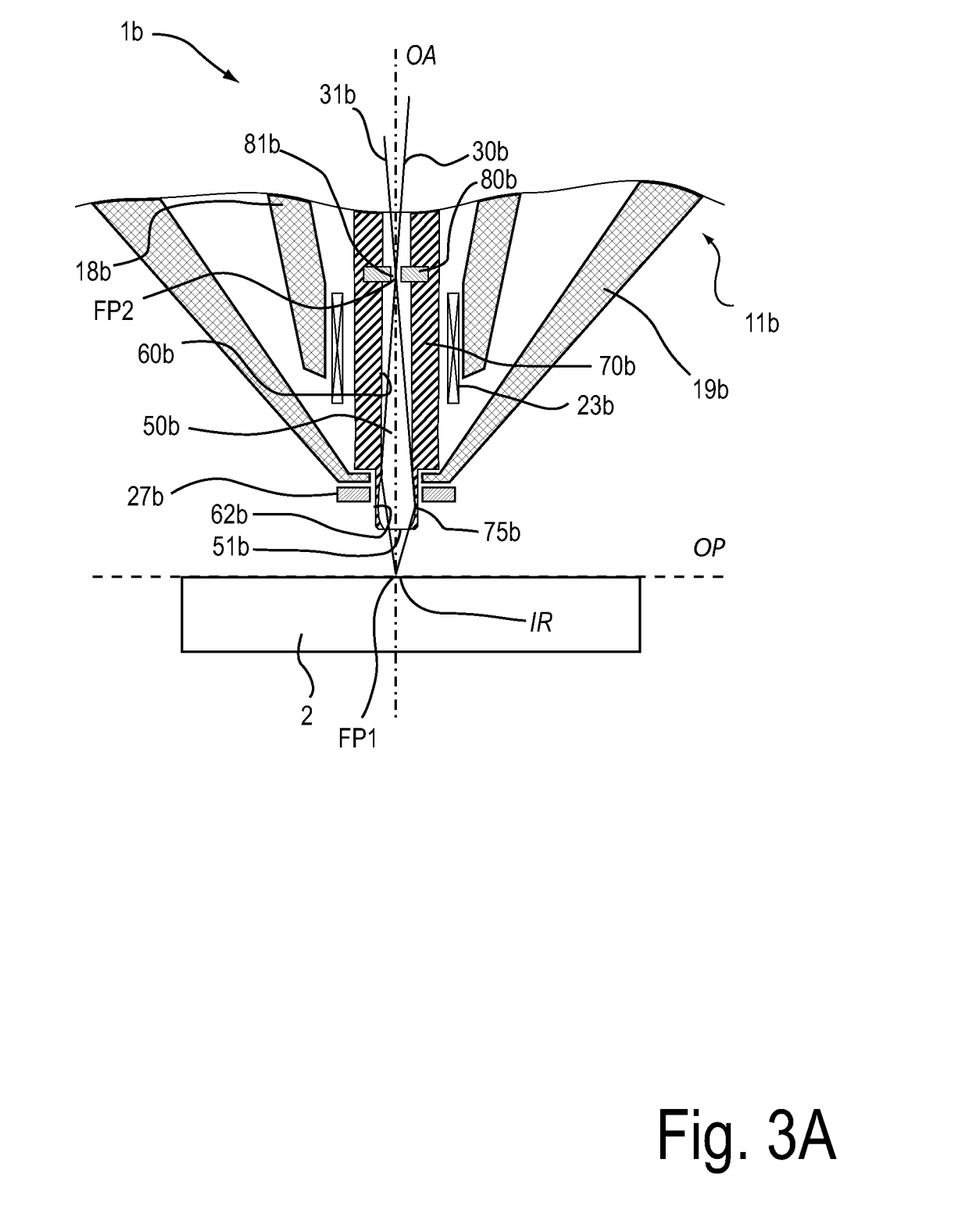
FIG. 3A is a schematic illustration of a system according to a third exemplary embodiment.

FIG. 3A is a schematic illustration of a further exemplary embodiment. Components, which correspond to components of the particle beam system shown in FIGS. 1A and 1B, with regard to their composition, their structure and/or function are generally designated with the same reference numerals, which however have an additional letter added to show differentiation.

The system 1b includes a diaphragm 80b, which is arranged in the electron beam path and in the light beam path. The diaphragm 80b includes a pressure limiting aperture 81b. The electron beam path and the light beam path extend through the pressure limiting aperture 81b.

The hollow light guide 70b includes an object side end portion 75b having an interior surface 62b, which is shaped in the form of a portion of an ellipsoid, in particular of a prolate spheroid. Therefore, the interior surface 62b is an ellipsoidal mirror. The interior surface 62b is part of the mirror surface of the channel 50b of the hollow light guide 70b.

The interior surface 62b of the object side end portion 75b is configured such that a first focus point FP1 of the interior surface 62b is located at an intersection point of the optical axis OA and the object plane OP. The location of the object plane OP relative to the objective lens 11b may depend on settings of the electron optical system of the system 1b. Therefore, the first focus point FP1 may be located at an intersection point of the optical axis OA and the object plane OP, at a specific setting of the electron optical system for acquiring cathodoluminescence data. For example, a minimum distance between the first focus point FP1 and the objective lens, which is located closest to the object plane OP may be in the range of 5 mm to 15 mm.

The position of the first focus point FP1 can be selected to coincide with that position along the optical axis OA, at which the objective lens 11b of the electron optical system can achieve the highest resolution, i.e. where a focused electron spot or charged particle spot is generatable having the smallest extent in a direction perpendicular to the optical axis OA of the electron optical system.

The interior surface 62b is further configured such that a second focus point FP2 of the interior surface 62b is located in the pressure limiting aperture 81b or between the entrance aperture 51b and the pressure limiting aperture 81b. Hence, light rays 30b, 31b, which emanate from the interaction region IR in the object plane OP are focused into a focus region, which is located close to or at least partly within the pressure limiting aperture 81b.

Hence, a system 1b is provided, which allows to efficiently detect cathodoluminescence light and also to maintain a low vacuum level in the particle optical system of the system 1b. In particular, it is possible to separate the vacuum in the microscope column from the pressure inside the specimen chamber. Thereby, it is in particular possible to provide an environmental scanning electron microscope having a high collection efficiency for cathodoluminescence light.

Figure 3B:
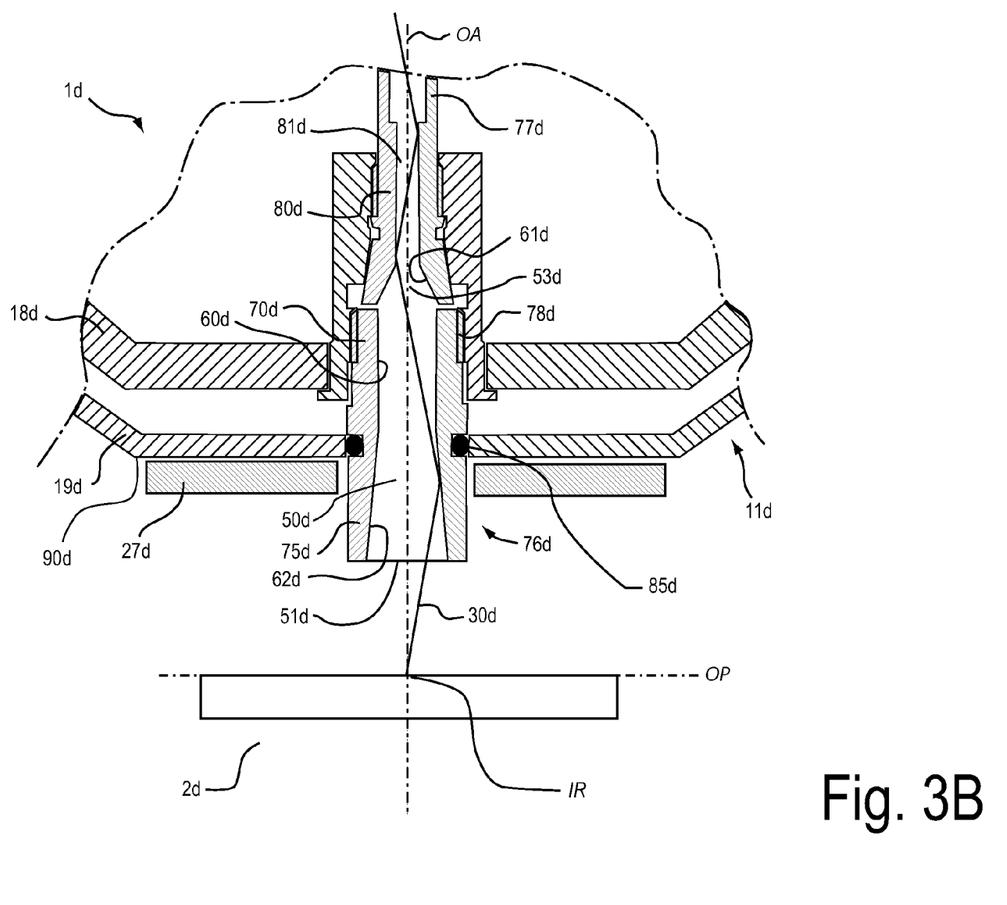
FIG. 3B is a schematic illustration of a system according to a fourth exemplary embodiment.

FIG. 3B illustrates a portion of a system 1d, which is a further exemplary embodiment. Components, which correspond to components of the particle beam system, as shown in FIG. 3A with regard to their composition or their structure and/or function are generally designated with the same reference numerals, which however have an additional letter added to show differentiation.

The system 1d includes a first hollow light guide 70d and a second hollow light guide 77d. Each of the first and the second hollow light guides 70d, 77d includes a channel 50d, 53d. Each of the channels 50d, 53d has an interior surface 60d, 61d, which includes a reflecting mirror surface. Furthermore, each of the hollow light guides 70d, 77d is arranged in the particle beam path and the light beam path such that the particle beam path is incident on the object plane OP after having passed each of the channels 50d, 53d and light rays of the light beam path are guided by one or more reflections at the mirror surfaces through each of the channels 50d, 53d. This is illustrated by light ray 30d. It is further conceivable that the system 1d includes more than two hollow light guides, in particular three or four hollow light guides, each of which being arranged in the particle beam path and the light beam path.

The first hollow light guide 70d, which is the hollow light guide of the first and second hollow light guides 70, 77d, which is located closest to the object plane OP, includes an outer thread 78d for co-operating with a corresponding thread of the objective lens 11d. The threads form a coupling system for detachably securing the first hollow light guide 70d to the particle optical system.

In the attached position, the first hollow light guide 70d includes a protruding portion 76d, which protrudes from the end face 90d of the objective lens 11d toward the object plane OP. The first hollow light guide 70d is configured such that the user may grip the protruding portion 76d with his hand or may engage a tool with the protruding portion in order to unscrew the threaded joint between the objective lens 11d and the first hollow light guide 70d.

With the first hollow light guide 70d removed, it is possible to acquire high-resolution images with the system 1d. The high-resolution images may for example be acquired by using the backscattered electron detector 27d at a short working distance.

Hence, the system 1d is versatile in that it is alternatively operable in a first mode for acquiring high-resolution images and in a second mode for efficiently detecting cathodoluminescence light.

The interior surface 62d of the object side end portion 75d of the first hollow light guide 70d tapers wider towards the object plane OP. Thereby, a solid angle subtended by light rays, which enter into the channel 50d is comparatively large. Alternatively, it is also conceivable that the interior surface 62d of the object side end portion 75d is either shaped in the form of a cylinder or shaped in the form of a portion of an ellipsoid, as has been discussed with reference to FIG. 3A.

The second hollow light guide 77d is arranged in the light beam path upstream of the first hollow light guide 70d and includes a nozzle 80d, which is configured such that it functions as a pressure limiting aperture 81b. The nozzle 80d includes an interior surface which includes a light reflecting mirror surface, such that light rays of the light beam path are guided by one or more reflections at the interior surface of the nozzle 80d through the nozzle 80d. Hence, the nozzle 80d forms part of the second hollow light guide. Additionally or alternatively, the first hollow light guide 70d may include a nozzle, which is configured such that it functions as a pressure limiting aperture. Between the first hollow light guide 70d and the aperture, which is formed by the end face 90d of the objective lens 11d there is provided an O-ring 85d for gastightedly sealing the interior of the objective lens 11d from the specimen chamber of the system 1d.

It is conceivable that the first hollow light guide 70d is replaceable by a tube-shaped component, which includes a further differential pressure aperture. Hence, with such a tube-shaped component, the object in the specimen chamber may be maintained at elevated pressures such as atmospheric pressure. This may allow to operate the system 11d as an environmental scanning electron microscope (ESEM).

Figure 4A:
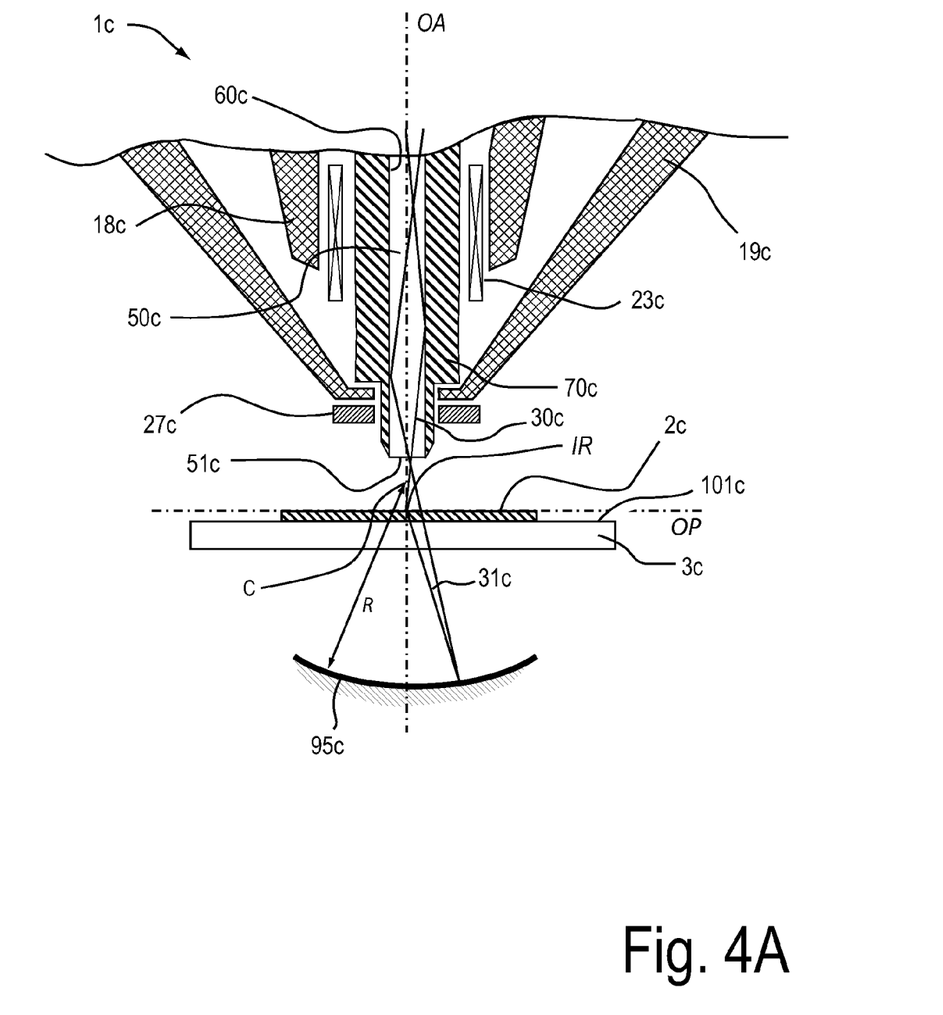
FIG. 4A is a schematic illustration of a system according to a fifth exemplary embodiment.

FIG. 4A is a schematic illustration of a further exemplary embodiment. Components, which correspond to components of the particle beam system shown in FIGS. 1A and 1B, with regard to their composition or their structure and/or function are generally designated with the same reference numerals, which however have an additional letter added to show differentiation.

The system 1c in FIG. 4A includes in addition to a charged particle beam system on one side of an object holder 3c a mirror 95c, which is arranged on a second side of the object holder 3c opposite to the side, where the charged particle beam system is provided. The mirror 95c is a concave mirror with the concave surface directed to the object holder 3c as well as to the charged particle beam system.

The mirror 95c is configured and arranged such that a portion of light rays, which emanate from the interaction region IR of the electron beam with the object 2c, and which miss the entrance aperture 51c of the hollow light guide 70c, are reflected by the mirror 95c toward the entrance aperture 51c. In FIG. 4a, this is illustrated by light ray 31c. The object 2c is disposed on an object holder 3c, which is light transmissive for at least a portion of the cathodoluminescence light. The object holder 3c has the form of a slide. The light transmissive object holder 3c has a first surface 101c, onto which the object 2c is disposed as a thin film. The thin film is light transmissive for at least a portion of the cathodoluminescence light. The first surface 101c is arranged or arrangeable in the object plane OP.

The mirror 95c may be rotationally symmetric with respect to the optical axis OA of the particle optical system of the system 1c. The mirror 95c may be a spherical mirror, wherein a distance between the object plane OP and the spherical mirror 95c, measured along the optical axis OA, is smaller than a radius of curvature R of the spherical mirror 95c and greater than half of the radius of curvature R. Thereby, light rays, which emanate from the interaction region IR and which are incident on the mirror 95c, are reflected into a region, which surrounds the optical axis OA and which is located between the object plane OP and the entrance aperture 51c, or which is located within the interior of the channel 50c. The center C of the spherical mirror 95c may be located between the object plane OP and the entrance aperture 51c of the hollow light guide 70c. In particular, the center C may be located halfway between the object plane OP and the entrance aperture 51c of the hollow light guide 70c.

Alternatively, the mirror 95c may be shaped in the form of a portion of an ellipsoid, in particular in the form of a prolate spheriod. The ellipsoidal mirror 95c may be configured such that a first focus point is located on the intersection point of the optical axis OA with the object plane OP and a second focus point is located between the object plane OP and the entrance aperture 51c, or is located in the interior of the hollow light guide 70c.

Accordingly, a system is obtained, which provides an improved light collection efficiency for detecting cathodoluminescence light.

Figure 4B:
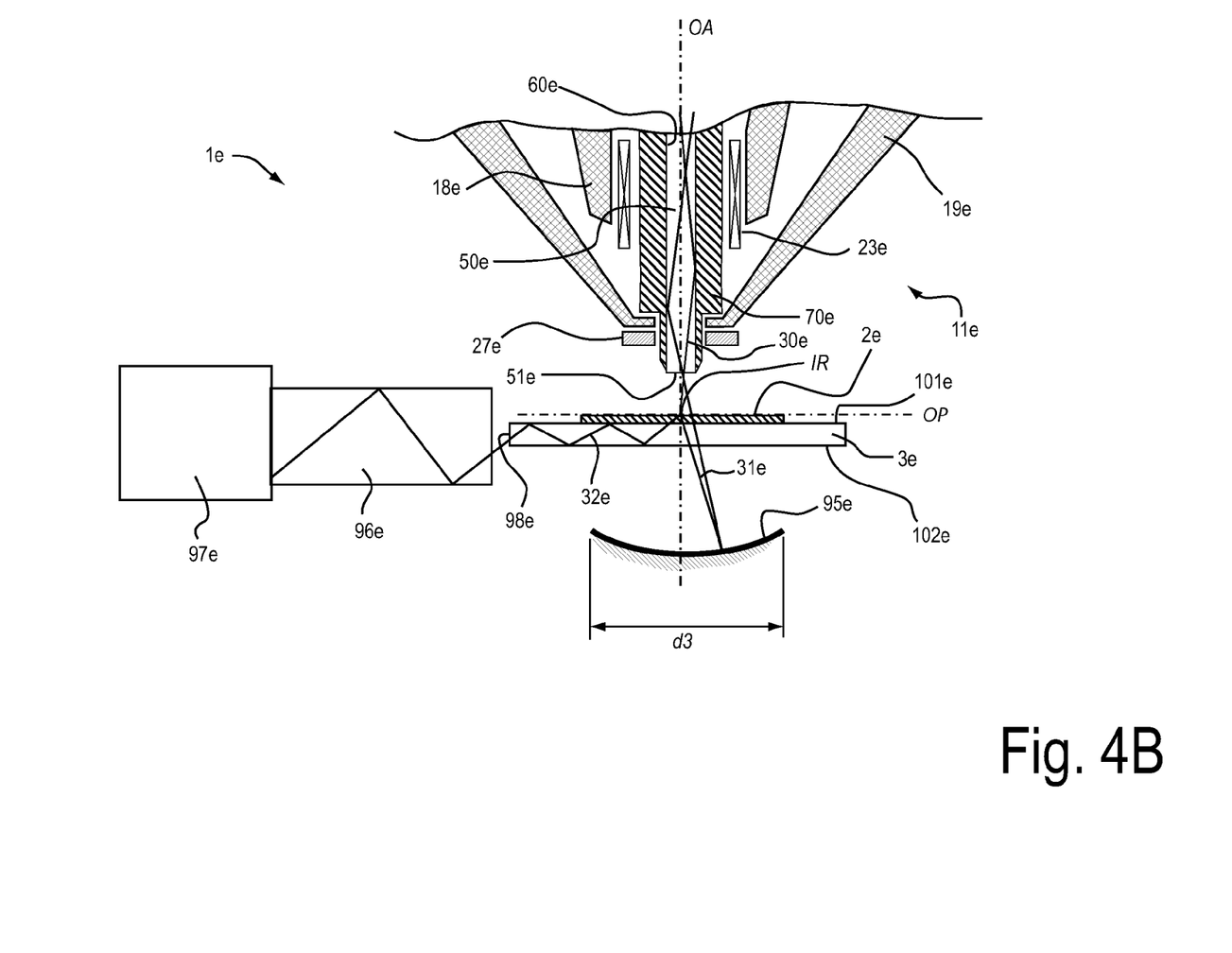
FIG. 4B is a schematic illustration of a system according to a sixth exemplary embodiment.

FIG. 4B is a schematic illustration of a system 1e, which is a further exemplary embodiment. Components, which correspond to components of the particle beam system shown in FIG. 4A, with regard to their composition or their structure and/or function are generally designated with the same reference numerals, which however have an additional letter added to show differentiation.

The system 1e in FIG. 4B includes in addition to a charged particle beam system on one side of an object holder 3e a mirror 95e arranged on a second side of the object holder 3e opposite to the side where the charged particle beam system is provided. The mirror 95e is a concave mirror with the concave surface directed to the object holder as well as to the charged particle beam system.

The system 1e has a second light beam path, which extends from an intersection of the optical axis OA with the object plane OP to a second photosensitive detector 97e. Light rays 32e of the second light beam path traverse the light transmissive object holder 3e before entering the second photosensitive detector 97e.

Light rays 32e of the second light beam path emanate from the interaction volume IR of the electron beam with the object 2e, leave the object 2e on a side facing away from the objective lens 11e and enter the light transmissive object holder 3e. The light transmissive object holder 3e is configured such that the light rays 32e of the second light beam path 32e are guided to an exit surface 98e of the light transmissive object holder 3e at which the light rays exit from the light transmissive object holder 3e. After having left the light transmissive object holder 3e, the light rays 32e either enter the second photosensitive detector 97e or enter a light guide 96e, which guides the light rays 32e toward the second photosensitive detector 97e. The light transmissive object holder has a first surface 101e, on which the object 2e is disposed and a second surface 102e, which is opposite to the first surface 101e. The second surface 102e is oriented parallel to the first surface 101e. Alternatively, the second surface 102e may be slanted relative to the first surface 101e. It is also conceivable that the second surface 102e include one or more surface portions, which are slanted relative to the first surface 101e. Thereby, the transparent object holder 3e may be in the form of a prism.

In the system 1e, a lateral extent d3 of the mirror 95e (i.e. an extend in a direction perpendicular to the optical axis OA of the particle optical system), may be dimensioned such that those light rays, which do not undergo total internal reflection at the second surface 102e, and which thereby leave the transparent object holder 3e through the second surface 102e, are incident on the mirror 95e. At least a portion of these rays may be reflected by the mirror toward the entrance aperture 51c of the hollow light guide 70c.

Accordingly, a system is obtained, which has a high collection efficiency for cathodoluminescence light.

Figure 5:
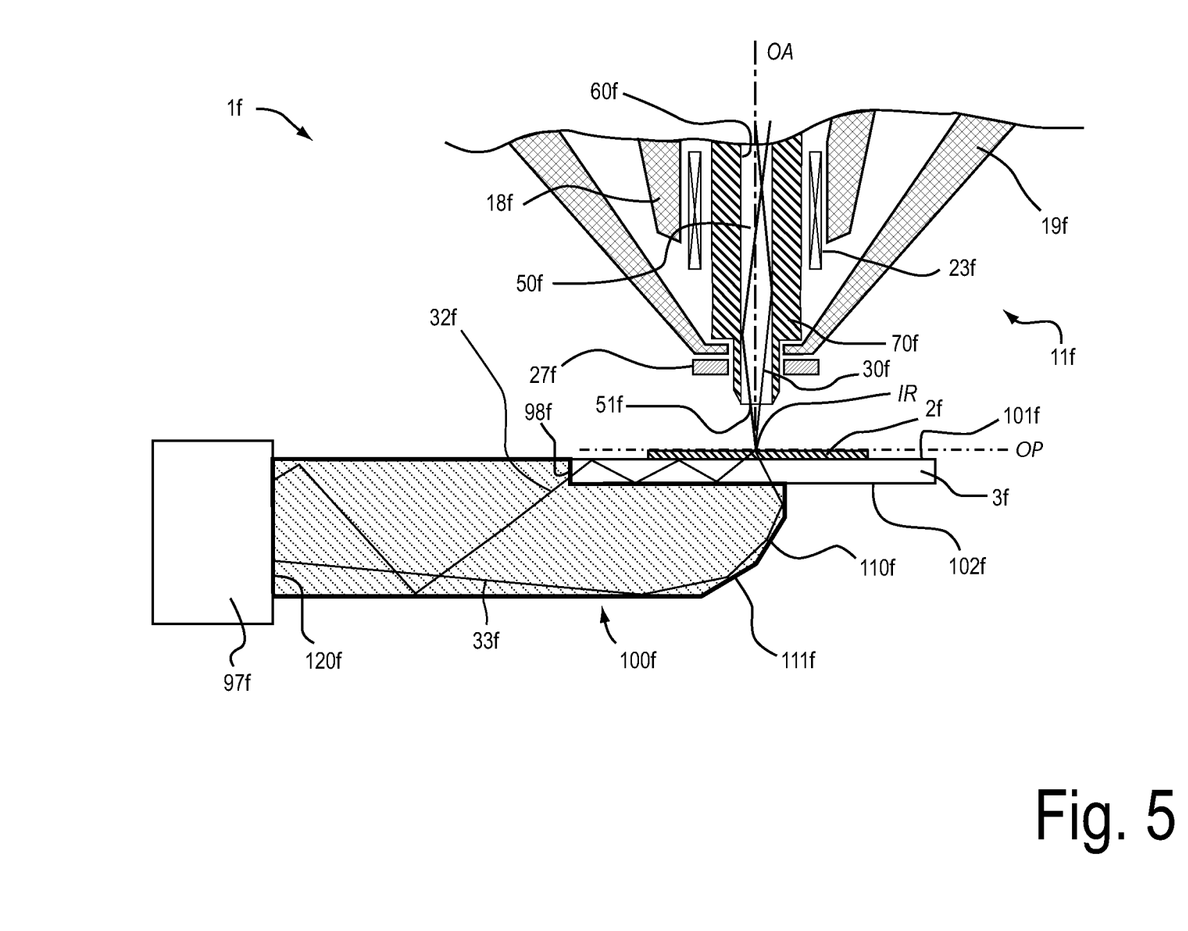
FIG. 5 is a schematic illustration of a system according to a seventh exemplary embodiment.

FIG. 5 is a schematic illustration of a system 1f, which is a further exemplary embodiment. Components, which correspond to components of the particle beam system as shown in FIGS. 4A and 4B with regard to their composition or their structure and/or function are generally designated with the same reference numerals, which however have an additional letter added to show differentiation.

The embodiment of FIG. 5 has two photosensitive detectors, one being a second photosensitive detector 97f, to which the cathodoluminescence light is conducted along a second light beam path and the other corresponding to the photosensitive detector 29 in FIG. 1, to which the cathodoluminescence light is conducted along the hollow light guide 70f, wherein at least a part of the hollow light guide 70f is arranged in the objective lens 11f. The detection signals of both photosensitive detectors can be added to increase the overall signal. This is especially useful in cases in which the intensity of emitted cathodoluminescence light is so weak that only individual single photons are emitted so that it is unlikely that both photosensitive detectors can detect a photon at the same time or within a narrow time interval. However in particular cases with a sufficiently strong cathodoluminescence signal it also might be useful to correlate the output signals of both photosensitive detectors in a manner that a signal evaluation unit only generates a signal if both photosensitive detectors have detected at least one photon within a predefined time interval and only such signals generated by the signal evaluation unit are used to generate an image.

The system 1f includes a light guide 100f, which is made of a material, which is light transmissive for at least a portion of the cathodoluminescence light. The light guide 100f may be made of a light transmissive material, such as glass or plastics.

The light guide 100f is configured such that at least a portion of light rays of the cathodoluminescence light, which emanates from the interaction volume IR of the electron beam with the object 2f and which traverses the light transmissive object holder 3f, is guided by the light guide 100f toward an exit surface 120f of the light guide 100f. In FIG. 5, this is illustrated by light rays 32f and 33f. Therefore, the system if has a second light beam path extending from the object plane OP to the second photosensitive detector 97f. The light rays of the second light beam path 32f, 33f exit the light transmissive object holder 3f at the second surface 102f (such as light ray 330 or at a side surface 98f of the light transmissive object holder 3f (such as light ray 320, which constitute exit surface portions of the light transmissive object holder. The second surface 102f of the object holder is on a side opposite to the side where the charged particle beam system is provided. The light guide 100f is configured such that light rays, which leave the light transmissive object holder 3f via the exit surface portions, enter the light guide 100f. For example, the light guide 100f is configured such that it includes light entry surface portions, which cover the light exit surface portions of the light transmissive object holder 3f.

After having left the light exit surface 120f, the light rays of the second light beam path enter the second photosensitive detector 97f or a further light guide, which guides the light rays to the second photosensitive detector 97f.

In the system 1f, the light guide 100f has the form of a prism which includes one or more slanted surface portions 110f, 111f, each of which is slanted relative to the first surface 101f of the light transmissive object holder 3f. The first surface 101f of the light transmissive object holder 3f is arranged or arrangeable in the object plane OP. Additionally or alternatively, the light guide 100f may have one or more arcuate surface portions.

While the disclosure has been described with respect to certain exemplary embodiments thereof, it is evident that many alternatives, modifications and variations will be apparent to those skilled in the art. Accordingly, the exemplary embodiments of the disclosure set forth herein are intended to be illustrative and not limiting in any way. Various changes may be made without departing from the spirit and scope of the present disclosure as defined in the following claims.

What is claimed is:

1. A system having a particle beam path, a light beam path and an object plane, the system comprising:
   a particle optical system, comprising:
   a charged particle beam source configured to generate a charged particle beam that travels along the particle beam path; and
   an objective lens configured to focus the charged particle beam onto the object plane; and a hollow light guide comprising a channel having an interior surface comprising a light reflecting mirror surface; and
   a photosensitive detector,
   wherein:
     the light beam path extends from the object plane to the photosensitive detector;
     during use of the system, the charged particle beam is incident on the object plane after having passed the channel; and
     during use of the system, light rays of the light beam path are guided through the channel by one or more reflections at the mirror surface.

2. The system according to claim 1, wherein the objective lens comprises a pole piece having a pole face aperture, and the light beam path extends through at least a portion of the pole face aperture.

3. The system according to claim 1, wherein the objective lens comprises an electrostatic lens electrode having an electrode aperture, and the light beam path extends through at least a portion of the electrode aperture.

4. The system according to claim 1, wherein the objective lens comprises a pole piece having a pole face aperture, and the hollow light guide extends through at least a portion of the pole face aperture.

5. The system according to claim 1, wherein the objective lens comprises an electrostatic lens electrode having an electrode aperture, and the hollow light guide extends through at least a portion of the electrode aperture.

6. The system according to claim 1, wherein in at least one plane, which is perpendicular to an optical axis of the particle optical system, a minimum radial distance of the hollow light guide from the optical axis is equal to or less than a minimum radial distance of the objective lens from the optical axis.

7. The system according to claim 1, further comprising a coupling system to detachably secure the hollow light guide to the particle optical system, wherein, while leaving the particle optical system in an assembled state, the coupling system is releasable and the hollow light guide is individually removable from the particle optical system.

8. The system according to claim 1, wherein the channel has an entrance aperture through which the light rays enter into the channel, and the entrance aperture is located between the objective lens and the object plane.

9. The system according to claim 1, further comprising a mirror, wherein the channel has an entrance aperture through which the light rays enter into the channel, and a portion of light of the light beam path is reflected at the mirror toward the entrance aperture and is detected by the photosensitive detector.

10. The system according to claim 1, wherein the channel has an exit aperture through which the light rays exit from the channel, the objective lens comprises a pole piece having a pole face, and an axial position of the exit aperture along an optical axis of the particle optical system is located between an axial position of at least a portion of the pole face and an axial position of the charged particle beam source.

11. The system according to claim 1, wherein the channel has an exit aperture through which the light rays exit from the channel, the objective lens comprises an electrostatic lens electrode, and an axial position of the exit aperture along an optical axis of the particle optical system is located between an axial position of at least a portion of the electrostatic lens electrode and an axial position of the charged particle beam source.

12. The system according to claim 1, further comprising:
a second photosensitive detector; and
a light transmissive object holder configured so that an object is attachable to the light transmissive object holder,
wherein the system has a second light beam path extending from the object plane to the second photosensitive detector, and light rays of the second light beam path traverse the light transmissive object holder before entering the second photosensitive detector.

13. The system according to claim 1, wherein the objective lens comprises an object side end face, the hollow light guide has a protruding portion which protrudes from an object side end face toward the object plane so that a minimum distance between the protruding portion and the object plane is less than a minimum distance between the objective lens and the object plane.

14. The system according to claim 1, wherein the objective lens has an object side end face, and the system comprises a particle detector at the object side end face of the objective lens.

15. The system according to claim 1, further comprising a pressure limiting aperture, wherein the light beam path and the particle beam path extend through the pressure limiting aperture.

16. The system according to claim 1, wherein the mirror surface of the channel is configured so that at least a portion of the light rays is focused into a focus region of the light beam path.

17. The system according to claim 16, further comprising a pressure limiting aperture, wherein the focus region is located at least partly in the pressure limiting aperture.

18. The system according to claim 1, wherein the hollow light guide is configured so that at least a portion of the light rays of the light beam path is first incident on the mirror surface of the channel after having been emitted from the object plane.

19. The system according to claim 1, further comprising a voltage supply, wherein the interior surface comprises a conductive surface connected to the voltage supply.

* * * * *

UNITED STATES PATENT AND TRADEMARK OFFICE
CERTIFICATE OF CORRECTION

| | | |
|---|---|---|
| PATENT NO. | : 8,648,301 B2 | Page 1 of 1 |
| APPLICATION NO. | : 13/623829 | |
| DATED | : February 11, 2014 | |
| INVENTOR(S) | : Stewart Bean et al. | |

It is certified that error appears in the above-identified patent and that said Letters Patent is hereby corrected as shown below:

In the Specification

In Col. 8, line 6, delete "the" and insert -- The --.

In Col. 16, line 23, delete "spheriod." and insert -- spheroid --.

In Col. 17, line 56, delete "if" and insert -- 1f --.

Signed and Sealed this
Third Day of June, 2014

Michelle K. Lee
*Deputy Director of the United States Patent and Trademark Office*